United States Patent
Sheperek et al.

(10) Patent No.: US 11,600,354 B2
(45) Date of Patent: Mar. 7, 2023

(54) DETERMINATION OF STATE METRICS OF MEMORY SUB-SYSTEMS FOLLOWING POWER EVENTS

(71) Applicant: Micron Technology, Inc., Boise, ID (US)

(72) Inventors: Michael Sheperek, Longmont, CO (US); Bruce A. Liikanen, Berthoud, CO (US); Steven Michael Kientz, Westminster, CO (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 17/301,348

(22) Filed: Mar. 31, 2021

(65) Prior Publication Data

US 2022/0059181 A1 Feb. 24, 2022

Related U.S. Application Data

(60) Provisional application No. 62/706,455, filed on Aug. 18, 2020.

(51) Int. Cl.
| | |
|---|---|
| G11C 29/44 | (2006.01) |
| G11C 29/12 | (2006.01) |
| G11C 29/42 | (2006.01) |

(52) U.S. Cl.
CPC ........ *G11C 29/44* (2013.01); *G11C 29/12005* (2013.01); *G11C 29/12015* (2013.01); *G11C 29/42* (2013.01)

(58) Field of Classification Search
CPC .... G11C 29/44; G11C 29/12005; G11C 29/42
See application file for complete search history.

(56) References Cited

U.S. PATENT DOCUMENTS

| | | | | |
|---|---|---|---|---|
| 11,301,382 B2* | 4/2022 | Sheperek | ............... | G11C 16/32 |
| 2022/0229554 A1* | 7/2022 | Muchherla | ............. | G11C 16/20 |

* cited by examiner

*Primary Examiner* — Tuan T Nguyen
(74) *Attorney, Agent, or Firm* — Lowenstein Sandler LLP

(57) ABSTRACT

Disclosed is a system including a memory device having a plurality of physical cells and a processing device, operatively coupled with the memory device, to perform operations that include selecting, responsive to detecting a power event, a subset of a plurality of memory cells of the memory device, the memory device being characterized by auxiliary read metadata identifying one or more read offsets for each of the plurality of memory cells, the one or more read offsets representing corrections to read signals applied to the respective memory cell during a read operation. The operations further include performing one or more diagnostic read operations for each of the subset of the plurality of memory cells of the memory device and modifying the auxiliary read metadata by updating the one or more read offsets for at least some of the plurality of memory cells of the memory device.

16 Claims, 7 Drawing Sheets

DETERMINATION OF STATE METRICS OF MEMORY SUB-SYSTEMS FOLLOWING POWER EVENTS

RELATED APPLICATIONS

This application claims the benefit of U.S. Provisional Application No. 62/706,455, filed Aug. 18, 2020, the entire contents of which are incorporated herein by reference.

TECHNICAL FIELD

Embodiments of the disclosure relate generally to memory sub-systems, and more specifically, relate to determination of state metrics of memory sub-systems following power events.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
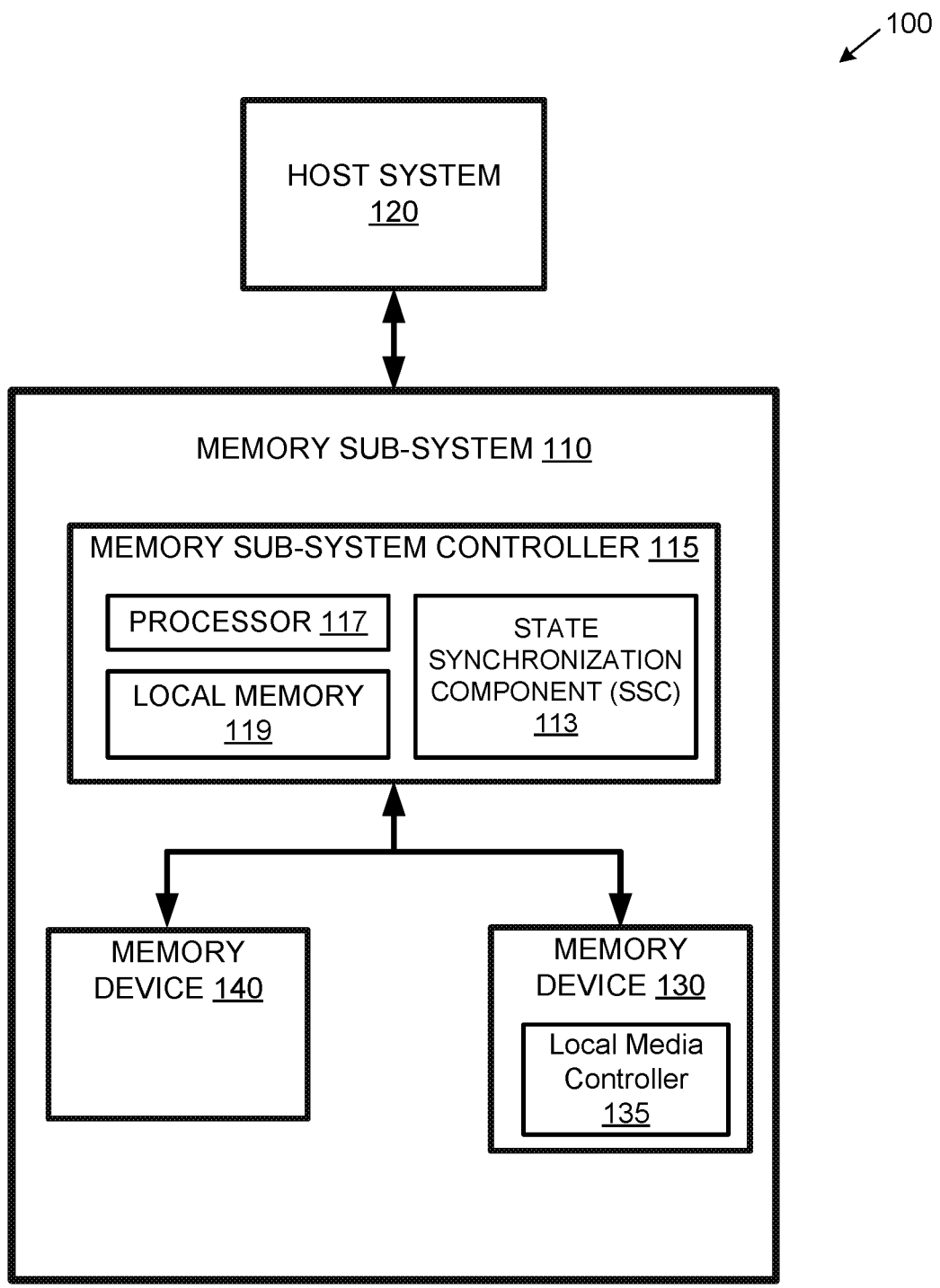
FIG. 1 illustrates an example computing system that includes a memory sub-system in accordance with some embodiments of the present disclosure.

Aspects of the present disclosure are directed to determination of state metrics of memory sub-systems following power events. A memory sub-system can be a storage device, a memory module, or a hybrid of a storage device and a memory module. Examples of storage devices and memory modules are described below in conjunction with FIG. 1. In general, a host system can utilize a memory sub-system that includes one or more memory components, such as memory devices that store data. The host system can provide data to be stored by the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a negative-and (NAND) memory device. Other examples of non-volatile memory devices are described below in conjunction with FIG. 1. Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells capable of storing, depending on the memory cell type, one or more bits of information. A memory cell can be programmed (written to) by applying a certain voltage to the memory cell, which results in an electric charge being held by the memory cell, thus determining a voltage signal $V_{CG}$ that has to be applied to a control electrode of the cell to open the cell to the flow of electric current across the cell, between the source electrode and the drain electrode. More specifically, for each individual memory cell (having a charge Q stored thereon) there can be a threshold control gate voltage $V_T$ (herein also referred to as the "threshold voltage" or simply as "threshold") such that for $V_{CG} < V_T$ the source-drain electric current is low. The current increases substantially once the control gate voltage has exceeded the threshold voltage, $V_{CG} > V_T$. Because the actual geometry of the electrodes and gates varies from cell to cell, the threshold voltages $V_T$ can be different even for cells implemented on the same die. The memory cells can, therefore, be characterized by a distribution P of the threshold voltages, $P(Q, V_T) = dW/dV_T$, where dW represents the probability that any given cell has its threshold voltage within the interval $[V_T, V_T + dV_T]$ when charge Q is placed on the cell.

A high-quality memory device can have distributions $P(Q, V_T)$ that are narrow compared with the working range of control voltages tolerated by the cells of the device. Accordingly, multiple non-overlapping distributions $P(Q_k,$ $V_T$) ("valleys") can be fit into the working range allowing storing and reliably detecting multiple values of the charge $Q_k$, k=1, 2, 3 . . . . The distributions (valleys) are interspersed with voltage intervals ("valley margins") where none (or very few) of the memory cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_T$ exhibited by the memory cell to one or more reference voltage levels corresponding to known valley margins (e.g., centers of the margins) of the memory device.

Due to the phenomenon known as slow charge loss (SCL), the threshold voltage $V_T$ of a memory cell can change with time as the electric charge of the cell is diminishing, the process sometimes referred to as "temporal voltage shift" (TVS). Since typical cells store negatively charged particles (electrons), the loss of electrons causes the voltage thresholds to shift along the voltage axis towards lower voltage thresholds $V_T$. The threshold voltages can change rapidly at first (immediately after the memory cell is programmed) while slowing down at larger times in an approximately power-law fashion, $\Delta V_T(t) = -C*t^b$, with respect to the time t elapsed since the cell programming event. In some embodiments of the present disclosure, TVS can be mitigated by keeping track of the time elapsed since the programming event as well as of the environmental conditions of a particular memory partition (block, plane, etc.) and associating a voltage offset $\Delta V_T$ to be used during read operations, where the standard "base read level" threshold voltage $V_T$ (displayed by the cell immediately after programing) is modified by the voltage offset: $V_T \to V_T + \Delta V_T$. Whereas TVS is a continuous process and the compensating correction $\Delta V_T(t)$ can be a continuous function of time, adequate accuracy of offsets can be achieved in some embodiments with a discrete number of offset "bins." Each bin can be associated with "families" of blocks (or any other memory partitions) programmed within a specified time window and under similar environmental (e.g., temperature) conditions. Since the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. In an illustrative example, a new family can be created ("opened") whenever a specified period of time Δt (e.g., a predetermined number of minutes) has elapsed since the creation of the last block family or whenever the reference temperature of memory cells has changed by more than a specified threshold temperature AO (e.g. 10K, 5K, or any other value). Similarly, the family can be "closed" (and a new family can be created) after the time Δt has elapsed since the family was created or if the reference temperature has changed (in either direction) by more than ΔΘ. A memory sub-system controller can maintain an identifier of the active block family, which is associated with one or more blocks as they are being programmed.

The memory sub-system controller can periodically perform a calibration process in order to associate partitions of various families with one of the bins. Each bin, in turn, can be associated with a set of the voltage offsets to be applied for read operations. The associations of partitions with families and families with bins is referred herein as auxiliary read metadata (ARM), which represent a part of broader state metrics of the memory device. The state metrics can also include the number of retired physical memory blocks (or other partitions), the number of times various physical blocks have been erased, types of configurations of cells of various memory partitions (e.g., single-level cell vs. multi-level cells), or any other type of information representative of the state of the memory device. The ARM can be stored in metadata tables maintained by the memory sub-system controller.

In accordance with embodiments of the present disclosure, the TVS can be selectively tracked for programmed partitions that are grouped into families. Based on the groupings of partitions into families, appropriate bin-specific read (voltage) offsets are applied to the base read (voltage) levels in read operations. Base read levels can also be stored in the metadata of the memory device. Upon receiving a read command, the memory sub-system controller can (1) identify the family associated with the memory partition identified by the logical address specified in the read command, (2) identify the current bin associated with the identified family, (3) determine a set of read offsets for the identified bin, (4) compute the new read voltages by additively applying the read offsets associated with the identified bin to the base read levels, and (5) perform the read operation using the new read voltage, as described in more detail below.

Power events, such as power surges, powering down (planned or accidental) and subsequent powering up of the memory sub-system can significantly disrupt the TVS dynamics. As a result, associations of memory partitions with specific bins, as determined prior to the power event and stored in the metadata tables, may no longer adequately identify read voltage offsets (as specified by the respective bins) for reliable post-event read operations.

Aspects and embodiments of the present disclosure address this problem by disclosing family-bin resynchronization following a power event for minimizing errors in subsequent read operations. In some embodiments, the memory sub-system controller can initiate calibration of the memory subsystem to update the stored family-bin associations. Because read operations can be initiated (e.g., by a host system) shortly after the memory sub-system is returned to the powered-up state, it can be advantageous to perform resynchronization (calibration and updating) quickly. Aspects of the present disclosure describe efficient calibration that can be performed in a quick manner. More specifically, the memory sub-system controller can select a number of memory partitions belonging to at least some of the families to determine how TVS has changed during the power event. Within each selected memory partition, the controller can further select (e.g., randomly) a number of memory cells and perform read operations on the selected memory cells. The read operations can be performed using multiple values of the read voltages $V_R$, and respective bit error counts, $E(V_R)$, can be determined for the voltages $V_R$. Using these values of $E(V_R)$, the memory sub-system controller can estimate (e.g., using interpolations) the locations of the centers (bottom) of the valley margins separating threshold voltage distributions in the selected families of memory partitions. From the locations of the centers of the post-power event valley margins, the memory sub-system controller can determine the current voltage offsets ΔV for the tested families. The memory sub-system controller can adjust distributions of the tested families among the bins, e.g., by moving one or more families to different bins corresponding to higher TVS and having larger read voltage offsets. Accordingly, during subsequent read operations, the memory sub-system controller will apply different (larger) voltage offsets ΔV to the memory partitions of the moved families. In some embodiments, as explained in more detail below, after calibrating some of the families, the memory sub-system controller can stop further calibration, if it is determined, or extrapolated, that the untested families are likely to remain in their respective pre-power event bins. Such a procedure allows optimal and quick updating (resynchronization) of the family-bin associations.

Advantages of the systems and methods implemented in accordance with some embodiments of the present disclosure include, but are not limited to, improving performance of memory sub-systems by reducing the rate of errors in read operations following planned or unexpected power events, such as power downs and power surges, as well as other sudden changes of environmental conditions, e.g. temperature surges.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115, for simplicity) can communicate with the memory devices 130, 140 to perform operations such as reading data, writing data, or erasing data at the memory devices 130, 140 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130, 140. The memory sub-system controller 115 can be responsible for other operations such as wear leveling operations, garbage collection operations, error detection and error-correcting code (ECC) operations, encryption operations, caching operations, and address translations between a logical address (e.g., logical block address LBA, zoned namespace) and a physical address (e.g., physical block address (PBA)) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a state synchronization component (SSC) 113 which can, responsive to detecting a power event, initiate calibration of various memory partitions of the memory sub-system 110 and update, based on the results of the calibration, the ARM, e.g. the family-bin associations of families of memory partitions of the memory sub-system 110, as described in more detail below. As part of the calibration, SSC 113 can perform random selection of memory partitions for calibration within the one or more memory devices 130, 140, conduct error correction analysis of read operations on the selected memory partitions, determine locations of valley margins shifted as a result of the power event, update the family-bin associations, store the updated associations in the metadata tables, and perform other tasks related to state synchronization triggered by the power event. The metadata tables with ARM can be stored in the local memory 119 or in one or more memory devices 130, 140.

In some embodiments, the memory sub-system controller 115 includes at least a portion of the SSC 113. For example, the memory sub-system controller 115 can include a processor 117 (processing device) configured to execute instructions stored in local memory 119 for performing the operations described herein. In some embodiments, the SSC 113 is part of the host system 120, an application, or an operating system. In some embodiments, the SSC 113 can have configuration data, libraries, and other information stored in the memory device 130 (and/or the memory device 140).

Figure 2:
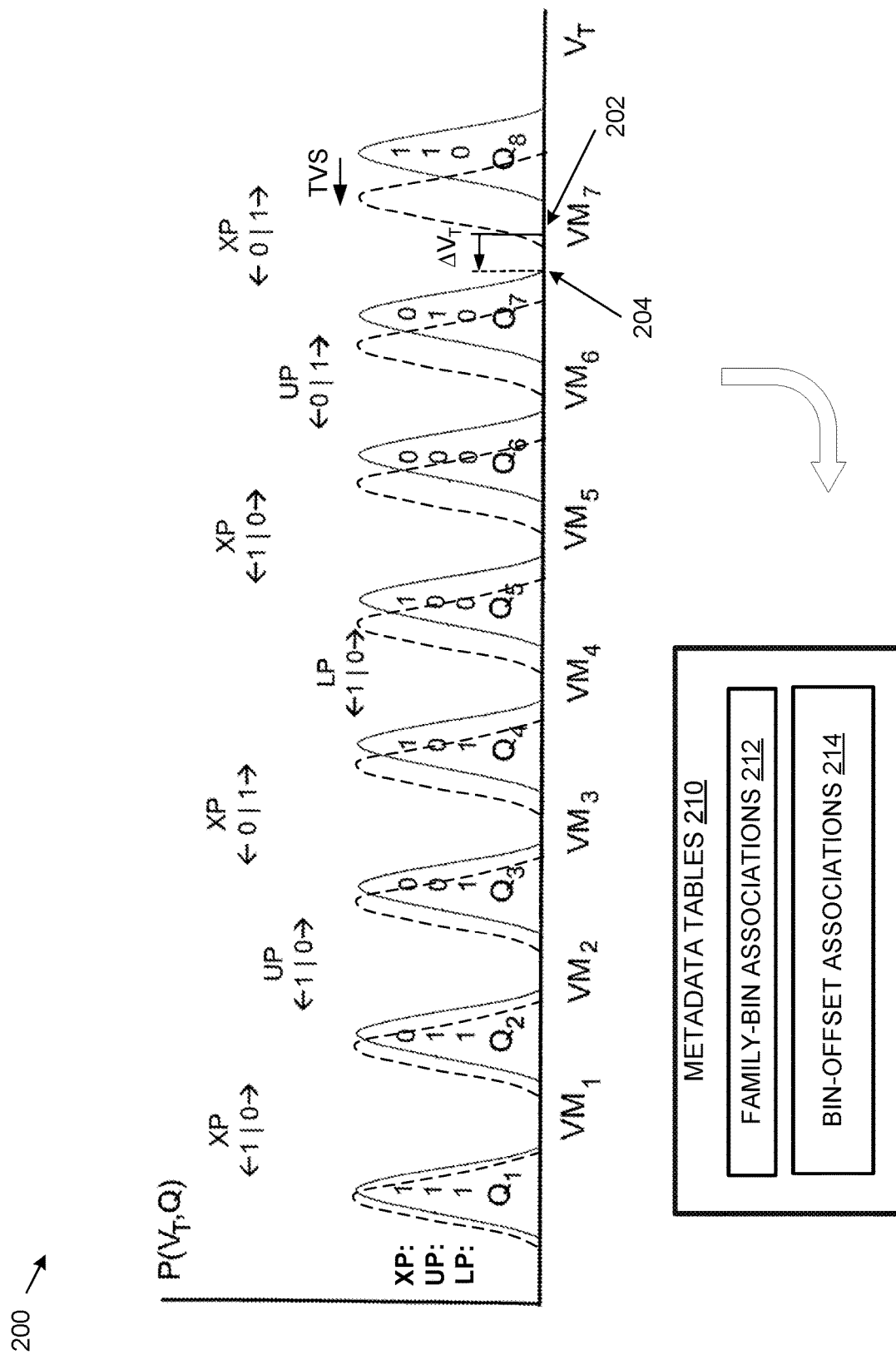
FIG. 2 illustrates schematically temporal voltage shift of a three-level memory cell capable of storing three bits of data by programming the memory cell into eight charge states that differ by the amount of charge on the cell's floating gate, in accordance with some embodiments of the present disclosure.

FIG. 2 illustrates schematically temporal voltage shift (TVS) of a three-level memory cell (TLC) capable of storing three bits of data by programming the memory cell into eight charge states $Q_k$ that differ by the amount of charge on the cell's floating gate, in accordance with some embodiments of the present disclosure. The distributions of threshold voltages $P(V_T, Q_k)$ are separated with 7 valley margins $VM_n$. The cell programmed into k-th charge state ($Q_k$) can store a particular combination of 3 bits. For example, the charge state $Q_k$ can store the binary combination 101, as depicted. This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not. A memory cell can be configured to store N=1 bits (SLC), N=2 bits (MLC), N=3 bits (TLC), N=4 bits (QLC), and so on, depending on how many distributions can be fit (and interspersed with adequate-size valley margins) within the working range of the control gate voltages. Even though FIG. 2 depicts a TLC, the operations described in the present disclosure can be applied to any N-bit memory cells.

Memory cells are typically joined by wordlines (conducting lines electrically connected to the cells' control gates) and programmed together as memory pages (e.g., 16 KB or 32 KB pages) in one setting (by selecting consecutive bitlines connected to the cells' source and drain electrodes). After three programming passes, a wordline of triple-level cells can store up to three pages: lower page (LP), upper page (UP), and extra page (XP). For example, upon the first programming pass, the cell can be driven to one of the charge states $Q_1, Q_2, Q_3, Q_4$ (corresponding to LP bit value 1, as shown in FIG. 2) or one of the charge states $Q_5, Q_6, Q_7, Q_8$ (corresponding to LP bit value 0). Upon the second path, when the UP is programmed into the same wordline, the charge state of the memory cell can be adjusted so that the range of possible locations of the cell's threshold voltage is further narrowed. For example, a cell that is in one of the charge states $Q_1, Q_2, Q_3$, or $Q_4$ (LP bit value 1) can be driven to just one of the two states $Q_1$ or $Q_2$, (corresponding to UP bit value 1) or to one of the two states $Q_3$ or $Q_4$ (corresponding to UP bit value 0). Similarly, upon the third programming path, the charge state of the memory cell can be fine-tuned even more. For example, a cell that is in the logic state 10 (i.e., UP bit stores value 1 and LP bit stores value 0) and is in one of the charge states $Q_7$ or $Q_8$ can be driven to state $Q_7$ (corresponding to XP bit value 0) or to state $Q_8$ (corresponding to XP bit value 1). Conversely, during a read operation, the memory controller 115 can determine that the applied control gate voltage $V_{CG}$ within the sixth valley margin $VM_6$ is not insufficient to open the cell to the source-drain electric current whereas the control gate voltage within the seventh valley margin $VM_5$ is sufficient to open the open the cell. Hence, the memory controller 115 can determine that the cell is in the charge state $Q_7$ corresponding to the logic state 010 (i.e. XP: 0, UP: 1, LP: 0).

The distributions of threshold voltages depicted with solid lines in FIG. 2 are distributions that the memory cells have immediately after programming. With the passage of time, as a result of a slow charge loss, the distributions shift (typically, towards lower values of $V_T$), as shown by the shifted valleys indicated with dashed lines. As a result, the threshold voltages of various memory cells are shifted by certain values $\Delta V_T$ that can depend on the time elapsed since programming, environmental conditions (e.g., ambient temperature), and so on. For optimal read operations, the controller 115 (or SSC 113) can, therefore, adjust the base read levels with the corresponding offsets $V_R \rightarrow V_R + \Delta V$, which are the same (or approximately the same) as the temporal voltage shifts. In one embodiment, the offsets can be determined (or estimated) as the difference between the center of the valley margin (such as the center 202 of $VM_7$) immediately after programming and the center of the same—but shifted—valley margin (such as the new center 204) at some later instance of time. As depicted schematically in FIG. 2, TVS of different distributions (valleys) and valley margins can differ from each other. In a typical scenario depicted in FIG. 2, TVS is greater for larger charges Q and smaller for lesser charges.

As shown in FIG. 2, the TVS in a memory device is a continuous process. In some embodiments, however, an adequate accuracy of voltage offsets can be achieved using a discrete set of bins and, accordingly, a discrete set of voltage offsets $\Delta V$. In such embodiments, TVS phenomenon can be addressed with setting up a number of discrete bins, e.g., five, eight, twenty, etc., associated with various memory partitions. The bin-related data can be stored in the metadata tables 210. The associations of various memory partitions (grouped into families, as described in more detail below) with bins can be stored in family-bin associations 212; the family-bin associations can dynamically change with the passage of time. For example, as the memory cells continue to lose charge with time, the respective memory partitions (grouped into families) can be moved, in a consecutive fashion, from junior bins to more senior bins having larger voltage offsets. Bin-offset associations 214 can also be stored in the metadata tables 210. In some embodiments, the bin-offset associations 214 can be static whereas the family-bin associations 212 can be adjusted (based on calibration of the memory partitions) to account for the actual charge loss by the memory cells of the respective partitions. In some embodiments, family-bin associations 212 can store logical addresses of the memory partitions, such as LBA of the respective blocks, while associations of LBAs with respective physical block addresses (PBA) can be stored outside the metadata tables 210, e.g., in memory translations tables stored separately in the local memory 119 or one of the memory devices 130, 140. In some embodiments, however, family-bin associations 212 can additionally include LBA-to-PBA translations or store direct PBA-to-bin associations. As schematically depicted with a curved arrow in FIG. 2, the number of bins, the bin-offset associations 214, the partition-bin associations can be based upon calibration of the memory device (or similar types of memory devices, e.g., during design and manufacturing) for maximizing performance and minimizing read errors during read operations.

Figure 3:
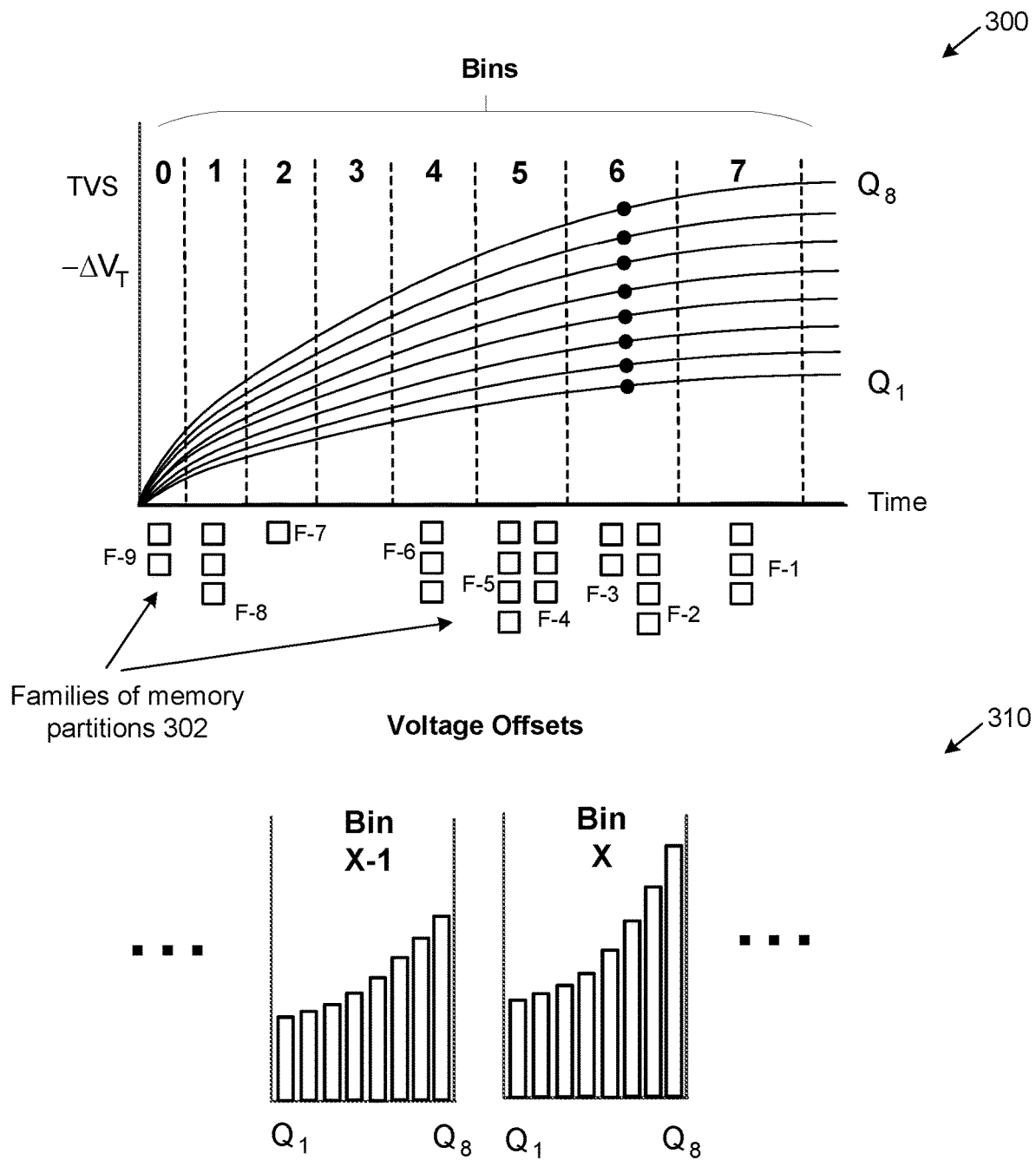
FIG. 3 illustrates schematically an exemplary auxiliary read metadata setup that includes family-bin associations and bin-offset associations, in accordance with some embodiments of the present disclosure.

FIG. 3 illustrates schematically an exemplary auxiliary metrics setup that includes family-bin associations 212 and bin-offset associations 214, in accordance with some embodiments of the present disclosure. Depicted in the top view 300 is a sketch of TVS for various charge states of a triple-level memory cell (from the lowest charge state $Q_1$ to the highest charge state $Q_8$). As illustrated, the threshold voltages can change rapidly at first (immediately after the memory cell is programmed) but slow down with the time elapsed since programming. In some embodiments, the dependence on time of the voltage shift can be approximated with a power-law function $-\Delta V(t, Q_k) = C_k * t^b$ where different constants $C_k$ describe evolution of different charge states $Q_k$. In some embodiments, the exponent b can be the same for all charge states, while in other embodiments the exponent b can depend on the charge state, for added accuracy of representation. The evolution of the threshold voltage in the top view 300 can be delineated with a set of bin boundaries (dashed lines) defining a number of bins: 0, 1, 2 . . . M. The number of bins can be determined empirically, based on calibration of the memory device (or similar-type memory devices). The bin boundaries can be defined using various metrics. For example, the boundaries can be placed so that the voltage $V_T(t)$, or the voltage shift $\Delta V(t)$, change no more than a predetermined value (or a pre-determined percentage of the respective $V_T(t)$ or $\Delta V$) across the temporal width of the bin. In some embodiments, the bin boundaries can be placed at equal increments of the logarithm log $\Delta V(t)$, which is (approximately) a linear function of time. Practically unlimited number of possible ways to setup bins and bin boundaries can be envisioned by a person of ordinary skill in this technology.

A simultaneously programmed memory partition (e.g. block, plane, etc.) can evolve from bin 0 to bin 1 to bin 2 and so on, as a natural result of the charge loss. The number of bins can be sufficiently large so that whenever the memory partition is between two bin boundaries (e.g., inside bin 6), application of some fixed voltage offsets that are uniform across the bin (regardless of whether the memory partition is closer to the left bin boundary, the center of the bin, or the right bin boundary) should ensure an adequate read operation performance. The read voltage offset values can be defined as average voltage offset values (indicated with black dots in bin 6), weighted averages, median values, and the like, of the voltage shifts $\Delta V(t)$ continuously evolving between the bin boundaries, e.g., the power-law fitting function. In some embodiments, however, the read voltage offset values can be obtained empirically, without using the power-law (or any other) fitting function, as the values that maximize performance (e.g., as the values that minimize read errors).

The read voltage offset values can be specific to a given charge state. The bottom view 310 of FIG. 3 depicts schematically bin-offset associations using a pair of consecutive bins (bin X−1 and bin X) as an example. Each bin may have an associated read voltage offset for each charge state, from the lowest charge state $Q_1$ to the highest charge state $Q_N$ (depending on the number of bits stored in the memory cell). As the bin number increases (e.g., from X−1 to X), the respective voltage offsets (indicated by the respective vertical bars in the bottom view 310) can increase as well. In some embodiments, the bin-offset associations can store N separate values for each of the N charge states of the memory cells. In some embodiments, however, the bin-offset associations can instead store two or more parameters of an interpolation function $F(Q_k, j)$ that determines the value of the voltage offset $\Delta V = F(Q_k, j)$ for the charge state $Q_k$ of bin j.

In some embodiments, when memory partitions are programmed and grouped into families 302, the newly-created families are initially assigned to bin 0, which corresponds to minimal TVS. As depicted in FIG. 3, family F-9 having two partitions (e.g., two memory blocks), depicted by white squares, has just been programmed and assigned to bin 0. As memory partitions "age" (with passage of time since programming), the respective families move to higher (more senior) bins—by being de-associated from more junior bins and associated with more senior bins. For example, family F-8 was programmed before F-9 and has already been moved to bin 1. Each bin can have an arbitrary number of families associated with them and each family include an arbitrary number of memory partitions, depending on how fast controller 115 programs new partitions and how fast the environmental conditions (e.g., temperature) change. For example, bin 5 has two families (F-4 and F-5) while bin 3 currently has no families (e.g., controller 115 did not perform any programming between the time family F-6 was closed and the first partition of family F-7 was programmed).

A family is a set of memory partitions programmed within a certain pre-determined time interval while the environmental conditions remain approximately the same. A family closes after a passage of the pre-determined time interval since the family opens or upon an occurrence of a substantial change in the environmental condition, whichever happens earlier. The substantial change can be a change in temperature (e.g., since the time when the family is opened) above some positive temperature increment (e.g., 10 K or any other value) or below some negative temperature increment (e.g., −5K, −10K, or any other value).

With time, the families depicted in FIG. 3, can move to the right, being re-associated with consecutively more senior bins. In some embodiments, the subsequent bin re-assignment can be performed by SSC 113 upon the passage of pre-determined times (depicted with dashed lines in FIG. 3). In some embodiments, however, for added accuracy of family-bin associations, calibration or scanning (synchronization) can be performed. SSC 113 can perform calibration of some or all families by selecting (e.g. randomly) various memory partitions of the family being tested, selecting (e.g., randomly) multiple pages from the selected partitions, performing read operations on the selected pages, and conducting error correction analysis to determine the optimal voltage offsets for the family being tested, as described in more detail in relation to FIG. 4. As a result of such calibration, the family can be determined to be aging "normally," so that the detected voltage offsets approximately follow the average or typical time evolution (depicted in the top view 300) of the voltage offsets $\Delta V(t, Q_k)$. In such instances, the association of the family with its current bin X can be maintained. In other instances, however, it may be detected during calibration, that the family is aging faster than could be expected based on the average time evolution of the voltage offsets $\Delta V(t, Q_k)$ and that the current detected voltage offsets correspond to the next bin X+1 (or any of the subsequent bins, X+2, X+3, . . . etc.). In such instances, SSC 113 can move the family forward to the appropriate more senior bin. In yet other instances, it may be detected during calibration that the family is aging slower than could be expected based on the average time evolution of the voltage offsets. More specifically, the family could have been previously moved to bin X from bin X−1 without calibration, based on the passage of time. Yet, during the next calibration, the family can be detected having voltage offsets that correspond to bin X−1 (bin X−2, etc.) rather than to the current bin X. In such instances, the family can be moved backward to the more junior bin X−1. "Fast" or "slow" aging can be predicated on more or less volatile environmental conditions, higher or lower quality of dies hosting the memory partitions assigned to the family under calibration, or on various other conditions.

When the memory subsystem 110 experiences a power event, such as a sudden unexpected loss of power or a planned shutdown, calibration cannot be performed until the power is restored. In some embodiments, the entire memory sub-system 110 can be powered down. In some embodiments, the memory sub-system 110 can remain powered up but some of the memory devices 130, 140 can be powered down. A power event can disrupt the normal aging of the families so that the evolution of the read offsets is no longer well approximated with the offsets of a typical continuously powered up memory sub-system. During a power-down, the memory controller may not be capable of keeping track of the environmental conditions (e.g., may not be capable of tracking temperature of various memory devices 130, 140). The system can remain powered down for an extended period of time under unfavorable environmental conditions. For example, the memory device can be placed in the trunk of a car and maintained there for many hours and even days. As a result, the pre-power event family-bin associations can become unreliable for providing offset data after the memory device is powered back up.

To address this problem, SSC 113 can initiate calibration after the memory sub-system 110 (or any of its memory devices 130, 140) is powered up. In some embodiments, because the host system 120 can begin making read requests soon after the memory sub-system 110 is operational, SSC 113 can initiate calibration (resynchronization) as soon as the access of the controller 115 to the memory devices 130, 140 is restored.

Figure 4:
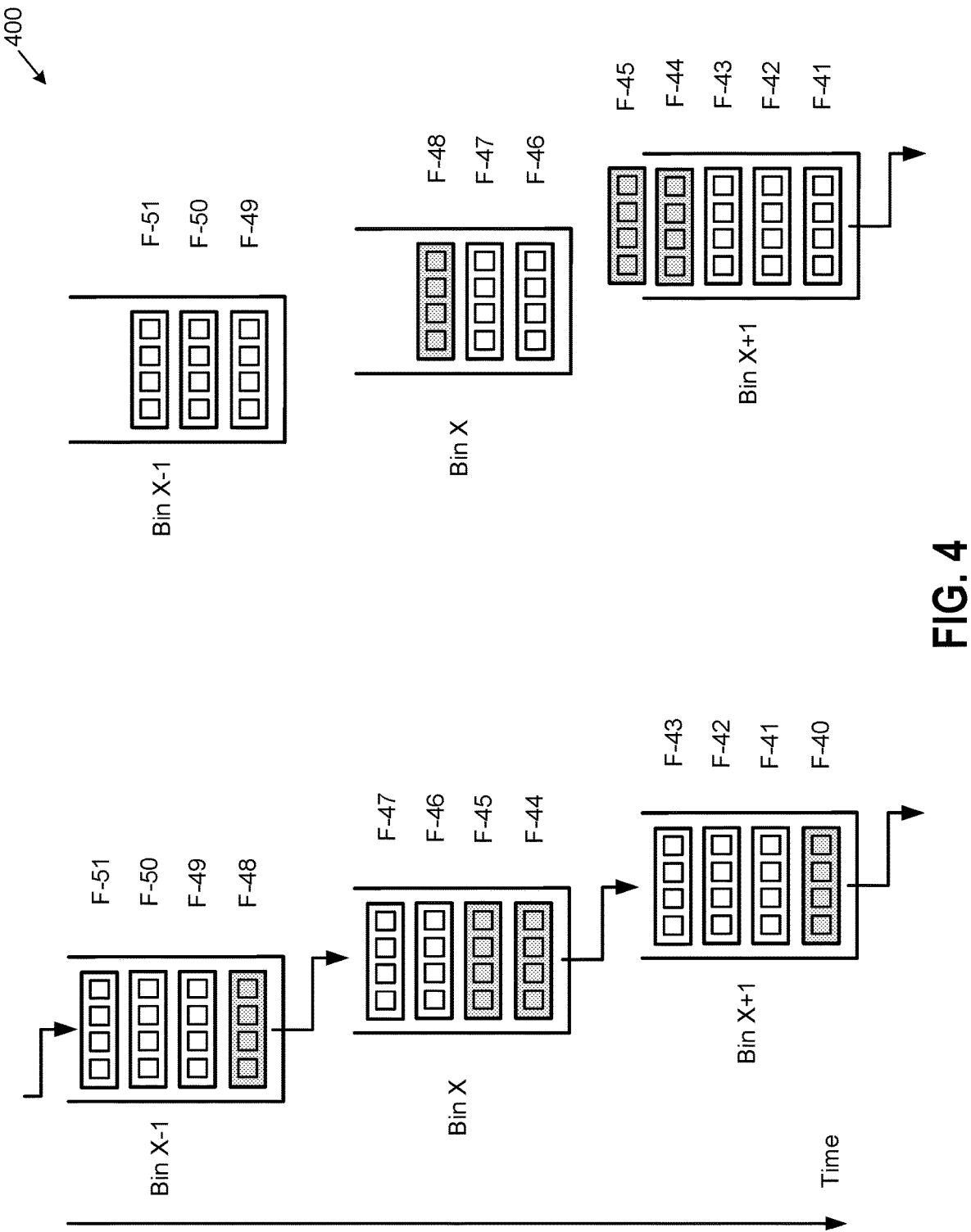
FIG. 4 illustrates schematically resynchronization of state metrics of the memory sub-system following a power event, in accordance with some embodiments of the present disclosure.

FIG. 4 illustrates schematically resynchronization 400 of state metrics of the memory sub-system following a power event, in accordance with some embodiments of the present disclosure. SSC 113 can perform resynchronization 400 starting from the most senior bin (e.g., bin N or any other most senior bin), or starting from the most junior bin (e.g., bin 0), or starting from a bin that is associated with the largest number of families, or starting from a bin that is associated with the families of memory partitions that are most likely to be read first by the host system 120, that store the most sensitive information, or based on any other criteria. In some embodiments, SSC 113 can perform resynchronization of all bins 0 . . . N. In some embodiments, SSC 113 can perform resynchronization of only some of the bins.

SSC 113 may select bin X which was associated (prior to the power down event, as shown in the left pane of FIG. 4, with families (from the oldest to the youngest) F-44, F-45, F-46, and F-47. Because memory cells of the memory partitions associated with the oldest family F-44 are likely to have the most significant TVS compared with other families of bin X, SSC 113 can start the calibration (resynchronization) process with F-44. Indeed, being closer to the next bin boundary, F-44 has a higher probability (of all families associated with bin X) to have moved to the next bin X+1 (or even further down the sequence of bins). Accordingly, there is a higher probability that the voltage offsets of bin X are no longer optimal for the read operations directed to memory partitions associated with F-44 (compared with bins F-45, F-46, etc.). If SSC 113 has determined (as explained in more detail in relation to FIG. 5) that the voltage offsets for the memory partitions associated with F-44 have crossed the boundary with the next bin X+1, SSC 113 can de-associate F-44 from bin X and associate F-44 with bin X+1. The controller can update family-bin associations 212 with the new association of F-44. The new family-bin associations are shown in the right part of FIG. 4, with F-44 is now being associated with bin X+1.

Similarly, SSC 113 can determine that family F-45 is to be de-associated from bin X and associated with bin X+1. The synchronization of bin X families can be continued until SSC 113 finds the oldest family, e.g., F-46 that remains in bin X. Because younger families (e.g., F-47) are likely to experience smaller TVS, SSC 113 can stop scanning of bin X after F-46 and assuming that all younger families of bin X also remain in bin X. Similarly, SSC 113 can perform scanning of bins X−1 and X+1 (as well as other bins not explicitly shown in FIG. 4). As depicted in FIG. 4, after resynchronization, family F-48 of bin X−1 is been associated with bin X whereas families F-49, F-50, and F-51 are still associated with bin X−1. Likewise, family F-40 of bin X+1 is been associated with bin X+2 whereas families F-41, F-42, and F-43 remain associated with bin X+1. The families that maintain associations after resynchronization are shown in FIG. 4 as white squares and the families that changed associations are shown as grey squares. In some embodiments, various bins are processed by SSC 113 in parallel. In some embodiments, the bins are processed consecutively but out of order, e.g., bin 6 is processed first, followed with bin 1, followed with bin 4, and so on.

Figure 5:
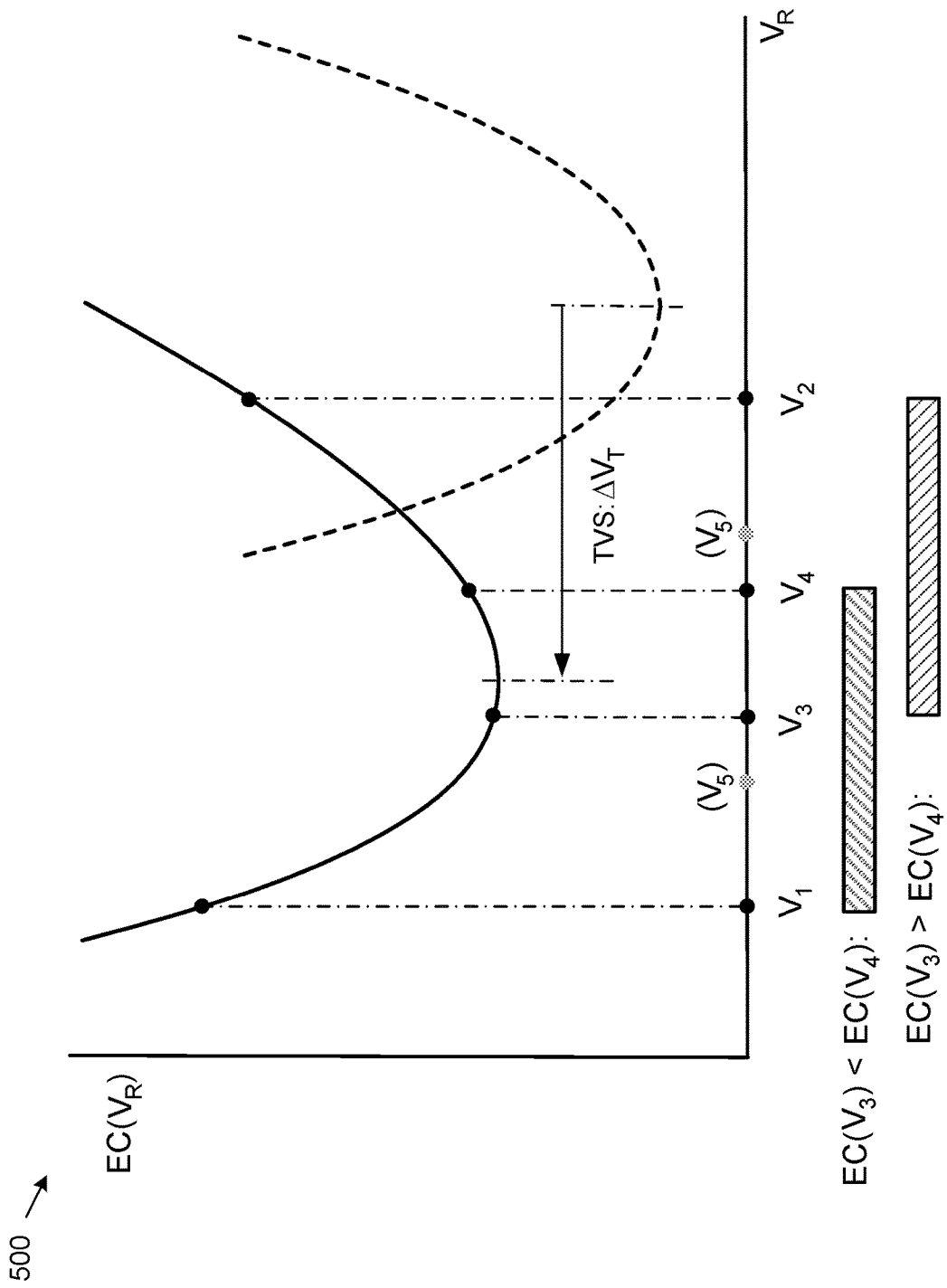
FIG. 5 illustrates schematically an example determination of the read voltage offsets used to compensate for the temporal voltage shift caused by a power event, in accordance with some embodiments of the present disclosure.

FIG. 5 illustrates schematically an example determination 500 of the read voltage offsets used to compensate for the temporal voltage shift caused by a power event, in accordance with some embodiments of the present disclosure. The example determination 500 can be used to obtain voltage offsets for any of the families, as part of the resynchronization described above in relation to FIG. 4. Specifically, after identifying a family for calibration, SSC 113 can select one or more memory partitions (e.g., blocks) associated with the identified family. In some embodiments, the memory partitions are selected randomly. From the selected memory partitions, SSC 113 can further select multiple memory cells. In some embodiments, the memory cells within the families are selected randomly. For the selected memory cells, SSC 113 can perform error count (EC) analysis in conjunction with diagnostic read operations. More specifically, for each of the memory cells, SSC 113 can perform multiple read operations while applying different read voltages $V_R$ and measuring EC for each read operation. The centers of the valley margins between various threshold distributions can be identified as minima of EC as a function of the read voltage, $EC(V_R)$.

The error count $EC(V_R)$ of a typical distribution immediately after programming is shown schematically in FIG. 5 with a dashed curve. The minimum of the error count $EC(V_R)$ corresponds to the center of the respective valley margin. For example, if the cell is programmed to be in the 1 1 0 logical state (the charge state $Q_8$), the minimum of $EC(V_R)$ is observed when the read voltage at the center of the valley margin $VM_7$, with reference to FIG. 2. With the passage of time since the programming operation and/or as a consequence of the power event, the error count curve $EC(V_R)$ can shift (e.g., towards lower read voltages $V_R$), as depicted schematically with the solid curve. To determine the corresponding threshold voltage shift $\Delta V_T$, the controller can identify the minimum of the function $EC(V_R)$. In some embodiments, the error count $EC(V_R)$ can be an average error count for the (randomly) selected memory cells.

To determine the minimum of $EC(V_R)$, SSC 113 can perform an iterative procedure in which read operations are performed for multiple values of read voltage $V_R$ and the error count is determined for each of the read voltage values. For example, in one embodiment, SSC 113 can perform a random search algorithm in which multiple read voltage values are selected and a value of the read voltage that corresponds to the lowest obtained error count is taken as the center of the valley margin that determines the voltage offset of the respective family. The accuracy of this scheme depends on the number of randomly selected read voltage values M. The number M can be determined from empirical optimization, by balancing accuracy against speed, e.g., by ensuring that the minimum is identified with a sufficiently high accuracy, on one hand, without extending the period of calibration too much, e.g., beyond a fixed target time.

In another embodiment, a fixed read voltage increment can be used instead. For example, SSC 113 can first start the read voltage scanning beginning from a known reference value $V_0$, such as the minimum of the $EC(V_R)$ curve immediately after a programming operation (dashed curve), and perform diagnostic read operations using consecutive read voltage values $V_0-\delta V$, $V_0-2\delta V$, $V_0-3\delta V$ . . . , until the behavior of the measured error count is reversed, e.g., until an initially decreasing error count starts to increase. The value of the read voltage at which the error count starts to increase can be taken as the center of the valley margin. In some embodiments, for added accuracy, once the reversal is detected, SSC 113 can reverse the sign of the read voltage increments while reducing their size, e.g., SSC 113 can start increasing the read voltage in increments of a fraction of the initial increment: $\delta V/n$, $2\delta V/n$, $3\delta V/n$ . . . , with an appropriate integer (or fractional) n. Such read voltage increment sign reversals (with progressively finer increments) can be performed several times, until the center of the valley margin is identified with a desired (e.g., predetermined) accuracy.

In another embodiment, a Golden Section search algorithm (GSSA) can be used, as depicted in FIG. 5. In GSSA, SSC 113 can start with identifying two points $V_1$ and $V_2$ that are located on opposite sides of the minimum of $EC(V_R)$. For example, the minimum value $V_0$ can be taken as one of the points $V_2$ whereas $V_1$ can be found in a way that is similar to the previous method, e.g., by using coarse increments V. After identifying starting points $V_1$ and $V_2$, SSC 113 can choose two additional points $V_3$ and $V_4$ inside the interval $[V_1, V_2]$ and determine the respective error counts $EC(V_3)$ and $EC(V_4)$. The algorithm can be based on the fact that, as indicated in FIG. 5, if $EC(V_3)<EC(V_4)$, the minimum lies between points $V_1$ and $V_4$, whereas if $EC(V_3)>EC(V_4)$, the minimum is between points $V_3$ and $V_2$. In other words, the minimum is always within the interval defined by the two points adjacent to the point with the least EC value detected so far. By repeating the same process and selecting new points within the identified narrower voltage interval, SSC 113 can iteratively confine the minimum of the EC curve to within an interval that is narrower than the desired accuracy, at which point the algorithm can stop.

In some embodiments, SSC 113 can choose the internal points (e.g., points $V_3$ and $V_4$) in a way that ensures that the relative spacing between points in successive iterations is the same. This is achieved by selecting the points $V_3$ and $V_4$ in such a way that satisfies the Golden Ratio requirement:

$$\frac{V_3 - V_1}{V_2 - V_3} = \frac{V_2 - V_4}{V_4 - V_1} = \frac{\sqrt{5} - 1}{2}.$$

As a result, no matter whether the interval $[V_1, V_4]$ or the interval $[V_3, V_2]$ is chosen for the next iteration, only a single new point $V_5$ would need to be tested (e.g., a single new value $EC(V_5)$ would need to be determined) whose two possible positions are indicated schematically with grey dots. In either instance, the proportions of the new interval $V_1$-$V_5$-$V_3$-$V_4$ or the new interval $V_3$-$V_4$-$V_5$-$V_2$ are the same as of the earlier interval $V_1$-$V_3$-$V_4$-$V_2$. By ensuring that the widths of both intervals $[V_1, V_4]$ and $[V_3, V_2]$ are the same regardless of which interval is chosen, GSSA ensures that no run of "bad luck" could lead to a wider interval being used many times, which would slow down the rate of convergence. By repeating the described iterations, SSC 113 can iteratively confine the minimum of the EC curve to within an interval (e.g. interval $[V_1, V_4]$ or $[V_3, V_2]$) that is narrower than the desired accuracy, at which point the algorithm can stop.

The three algorithms described above are exemplary. A person of ordinary skill in this technology should realize that there is a large number of efficient algorithms for finding a minimum of a function, many of which can be used successfully to determine the minimum of $EC(V_R)$.

Figure 6:
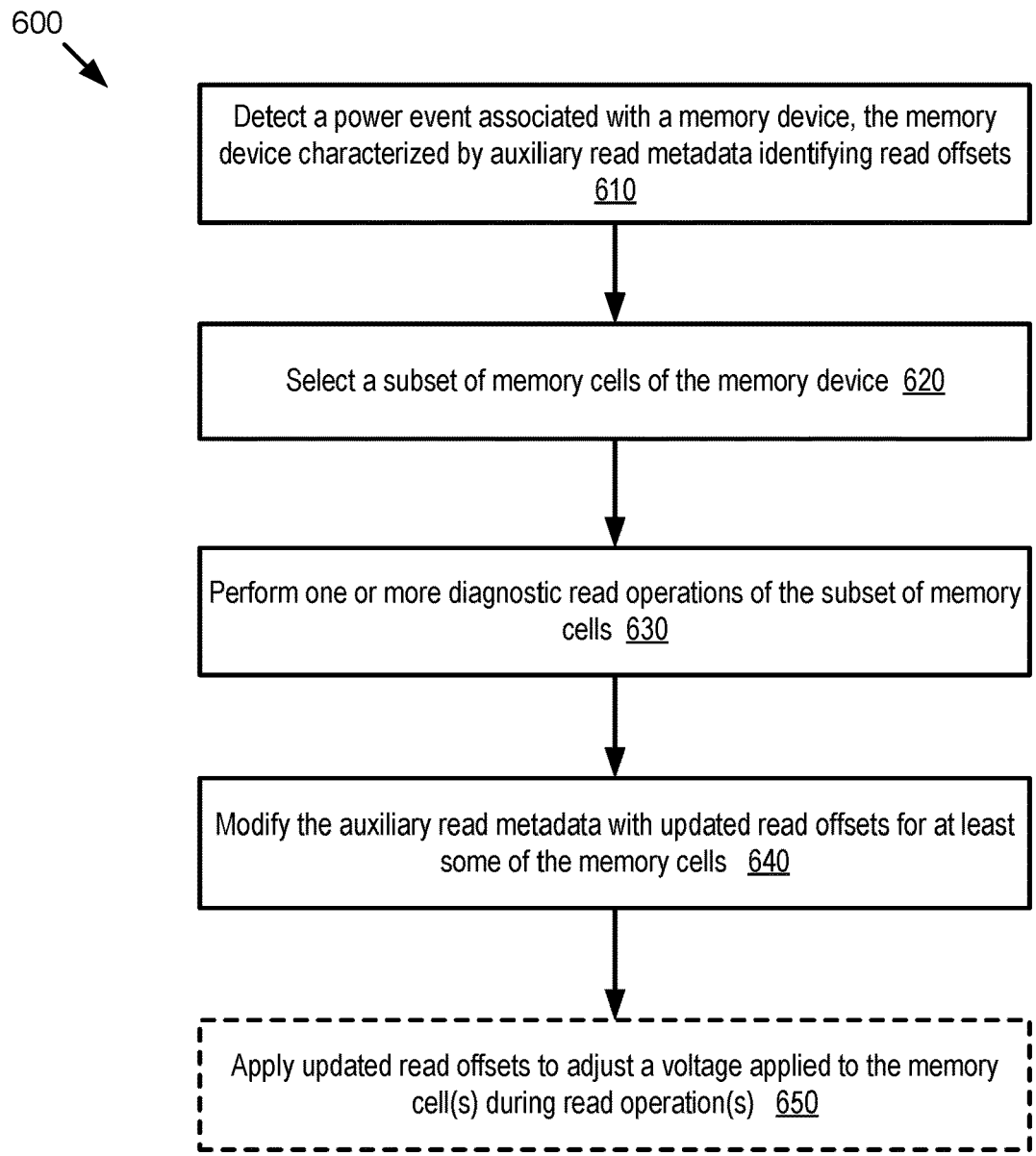
FIG. 6 illustrates a flow diagram depicting schematically an example method of resynchronization of state metrics of the memory sub-system following a power event, in accordance with some embodiments of the present disclosure.

FIG. 6 illustrates a flow diagram depicting schematically an example method 600 of resynchronization of state metrics of the memory sub-system following a power event, in accordance with some embodiments of the present disclosure. Method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, method 600 is performed by SSC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a processing logic performing method 600 can detect an occurrence of a power event associated with a memory device. The power event can include powering the memory device down and, subsequently, powering the memory device up. Upon powering up, the memory sub-system controller (e.g., controller 115) can execute a series of routines (such as boot and diagnostic routines). Additionally, the controller can execute an additional firmware routine responsible for initiation of the SSC 113, which can generate instructions to the processing logic to execute method 600. In some embodiments, the power event can include a power surge of the power delivered to the memory device. The memory device can include multiple memory cells organized into pages, blocks, planes, dies, or any other programmable and readable memory partitions of the memory device.

At operation 620, the processing logic can access auxiliary read metadata (ARM) for the memory device. ARM can be an element of broader state metrics indicating a state of the memory device and/or the memory sub-system of which the memory device can be a part. ARM can be used by the memory sub-system controller to compensate for the temporal voltage shift of read voltages caused by a charge loss in memory cells of the memory device. Specifically, ARM can identify one or more read offsets, for at least some memory cells and/or partitions of memory cells. The read offsets can representing corrections to read signals (e.g., voltage signals or current signals) that are applied to the respective memory cell during a read operation. For example, the read offsets can be voltage offsets that indicate a degree to which a (gate) voltage applied to a control gate electrode of the respective memory cell during the read operation, to compensate for a charge loss that has occurred since programming of the respective memory cell.

In some embodiments, the read offsets can depend on a charge state of the memory cell, the charge state being representative of data stored by the memory cell. More specifically, the amount of charge on the memory cell can be indicative of the logical state of the cell, e.g., bits of information stored in the memory cell. In some embodiments, when the memory cell stores multiple bits of information, some of the stored bits can be related to different logical pages (e.g., lower page, upper page, extra page, and so on) stored by larger partitions of the memory cells (e.g., pages). Because different logical states of memory cells are mapped on different amounts of charge placed on the memory cell, the rate at which the cells lose the charge with time can likewise depend on the amount of charge placed on the cell and, consequently, on the specific logical state of the memory cell. Typically, the larger the charge on the memory cell the stronger the charge loss (and the corresponding voltage shift). Accordingly, to determine the logical state of the memory cell using a read operation, a hardware read circuit of the memory sub-system can apply a set of read voltages $V_j + \Delta V_j$ that can differ from the base read voltages $V_j$ by the state-dependent offsets $\Delta V_j$ to minimize errors induced by the charge loss.

In some embodiments, instead of tracking read offsets for individual memory cells, the processing logic can track read offsets for memory partitions containing many memory cells. Generally, memory cells located in proximity of each other (e.g., on the same die) and programmed at similar times are likely to display similar charge loss patterns. To take advantage of such similarities in the charge loss patterns, the processing logic can initiate a number of families of memory partitions (e.g., families of memory blocks or simply "block families"). A family can include partitions (e.g., blocks, pages, planes, dies, or any other memory partitions) programmed within a time interval not exceeding a threshold time. Additionally, in some embodiments, a family can include memory partitions that are programmed under temperature variations not exceeding a threshold temperature variation. Furthermore, the processing logic can instantiate bins for grouping families that—by virtue of proximity in their programming times—are likely to have similar TVS and thus are likely to call for similar read offsets during read operations. Each of the bins can be associated with a set of read (e.g., voltage read) offsets for read operations that involve memory partitions (e.g., blocks, pages, planes, or any other partitions) associated with the respective bin, as descried in more detail above in relation to FIG. 3.

The processing logic can maintain associations (family-bin associations) of each the families with one of the bins. The processing logic can further maintain associations (bin-offset associations) of each of the bins with a respective set of read offsets. For example, each bin can have a number of different read offsets at least equal to the number of different logical states of the memory cell. The family-bin associations and the bin-offset associations can be stored in metadata table(s) and can be accessed by the processing logic. The metadata table(s) can further list various partitions (e.g., blocks) belonging to different families. In particular, during a read operation, the processing logic can receive a read request to read a specific block identified (e.g., by the host system 120) using the block's LBA (in some embodiments, using the LBA→PBA mapping tables) and identify the respective family to which the block belongs by accessing the metadata table(s). By accessing the family-bin associations, the processing logic can identify a bin to which the identified family belongs. Finally, by accessing the bin-offset associations, the processing logic can obtain the set of offset values for the identified family and perform, using the obtained set of the offset values, the read operation of the block identified by the read request.

Responsive to detecting that power event has occurred, the processing logic performing method 600 can make a selection of memory cells for calibration. For example, a number of memory partitions belonging to a first family, a second family, a third family, and so on can be selected for calibration. The selection can be performed randomly, in one embodiment. The terms "first," "second," "third," etc., should not be understood as implying that the families are ranked in some specific order, but should rather be understood as pointers (including out-of-order pointers) to any of the families of the memory device, regardless of the actual times at which the families were programmed.

At operation 630, the processing logic can perform calibration including performing one or more diagnostic operations for each of the selected memory partitions. The diagnostic operations can be read operations. In some embodiments, to perform calibration, the processing logic is to determine, in conjunction with the one or more diagnostic read operations, a plurality of error correction counts for memory cells of the selected memory partitions. In some embodiments, only a fraction (e.g., randomly selected) of memory cells of each selected memory partition undergoes calibration, to speed up the resynchronization. For example, the processing logic can perform error count diagnostics of the selected blocks of the first block family, of the second block family, third, fourth, etc., block families, and so on. The error count diagnostics can be performed until an estimate of the control gate read voltage value corresponding to the minimum error correction count is identified. The process of determining the minimum error correction can be performed via one or more iterations of increased accuracy until the predetermined resolution of the estimate is achieved, as described in relation to FIG. 5.

At operation 640, the processing logic performing method 600 can modify ARM with an updated, based on results of the diagnostics, identification of the one or more read offsets for at least some of the memory cells and/or memory partitions of the memory device. In some embodiments, to modify ARM, the processing logic can change a family-bin association of at least one of the families (e.g., block families). The change of the family-bin association can be based on the results of the error count diagnostics. For example, the processing logic can determine that the location of the center of the valley margin, or any other reference voltage that minimizes the error count during read operations, has shifted significantly enough so that the new read offset for the corresponding valley margin is now closer to the read offsets of the second bin (or the X+1-th bin) than the first bin (or the X-th bin) with which the family (e.g., the first family) is presently associated. The processing logic can then de-associate the first block family from the first bin (or the X-th bin) and associate the first block family with a second bin (or the X-th bin). Because, typically, temporal voltage shifts occur in a continuous monotonic way, the read offsets for the second bin (or any more senior bin) are larger than the corresponding (for the same charge state) read offsets for the first bin (or any more junior bin), see the top view 300 of FIG. 3. More specifically, the second bin read offset for the charge state Q is typically larger than the first bin offset for the same charge state Q for any given charge state j. It is, therefore, possible, in some embodiments, to determine (using error count analysis) TVS of a single charge state and use the determined TVS of this single charge state for updating the family-bin associations. For example, in a triple-level cell, TVS of the seventh (last) valley margin can be the largest and, therefore, the easiest to determine with a predetermined accuracy. Accordingly, the processing logic can use the memory cells programmed into charge state $Q_8$ for modifying (updating) family-bin associations after a power event. To speed-up TVS determination, the diagnostics of memory cells can be focused on the cells that (during the first read operation) are determined to be in the logical state corresponding to the charge state $Q_8$ and the error correction analysis can be performed using $Q_8$ cells. The randomly chosen cells that are determined (during the first read operation) to be in other logical states $Q_1 \ldots Q_7$ can be discarded. Although the highest charge state (e.g., $Q_8$) is used in the described embodiment, in other embodiments any other state that is empirically determined to be representative of the correct family-bin associations (e.g., state $Q_7$) can be used instead. In some embodiments, where accuracy is of more importance than speed, more than one charge state can be used for family-bin associations. For example, states $Q_7$ and $Q_8$ (or any pair of states) can be used.

In some instances, the processing logic can perform error count diagnostics and determine that the location of the center of the valley margin (or some other reference voltage that minimizes the error count during read operations) has not shifted significantly enough so that the read offset for the corresponding valley margin is still closer to the read offsets of the second bin (or the X+1-th bin) than the first bin (or the X-th bin) with which the family (e.g., the first family) is presently associated. Consequently, the processing logic can maintain association of the second block family with the first bin (or the X-th bin). Operations 640 and 650 can be performed for each bin maintained by the processing logic. In some embodiments, as described above in relation to FIG. 4, the processing logic can verify family-bin associations of only a limited number of families, e.g., starting with the oldest family associated with the bin and stopping further verification/reclassification of the current bin once the first family ("anchor family") is identified as retaining its association with the current bin. Other (younger) families, being programmed later than the anchor family, are likely to also maintain their associations with the current bin. Other bins can be resynchronized (recalibrated) in the similar manner.

As indicated by the dashed box (operation 650), after the processing logic performs modification of ARM, the updated read offsets can be applied to subsequent operations involving various memory cells belonging to families whose bin associations have been modified. For example, after family F-45 (with reference to FIG. 4) has been de-associated from bin X and associated with bin X+1 (in metadata tables 210), subsequent read operations directed to memory partitions of F-45 are to be performed using a set of offset read voltages of bin X+1. In some embodiments, performance of the method 600 can be predicated on an occurrence of a threshold condition. Because some power events are relatively brief and do not result in substantial voltage shifts, the processing logic can first perform calibration of one or more oldest families, e.g., associated with bin 0 or bin 1 (if bin 0 is empty). Memory partitions associated with the oldest families are most likely to experience significant voltage shifts. Accordingly, if the voltage shifts determined based on error count analysis of the one or oldest families are less than a critical voltage shift (e.g., set by a developer), the processing logic can refrain from performing method 600.

Figure 7:
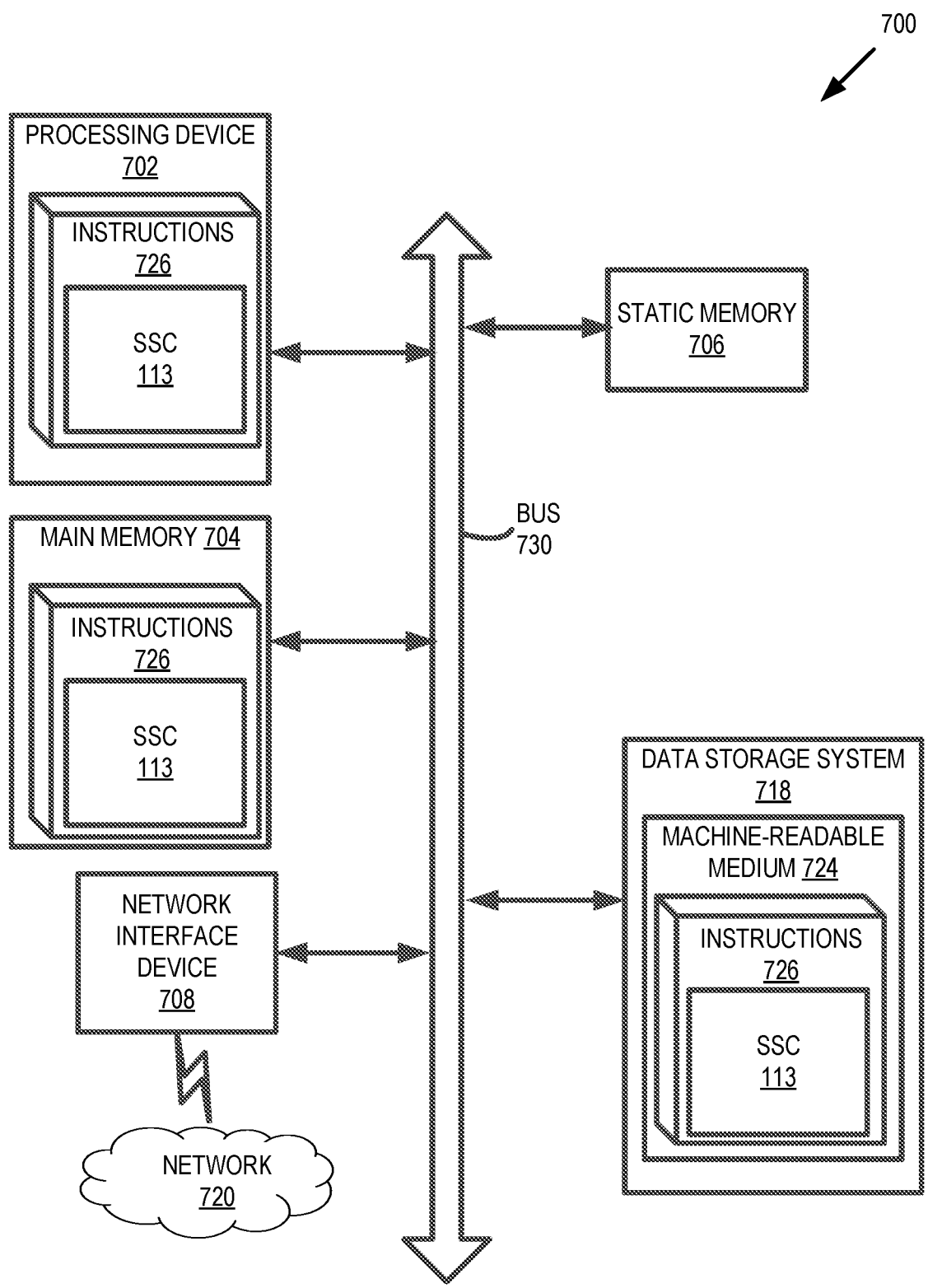
FIG. 7 a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the state synchronization component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 608 to communicate over the network 720.

The data storage system 718 can include a machine-readable storage medium 724 (also known as a non-transitory computer-readable storage medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one implementation, the instructions 726 include instructions to implement functionality corresponding to the state synchronization component 113 of FIG. 1. While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the disclosure. The term "machine-readable storage medium" shall accordingly be taken to include, but not be limited to, solid-state memories, optical media, and magnetic media.

Some portions of the preceding detailed descriptions have been presented in terms of operations and symbolic representations of operations on data bits within a computer memory. These algorithmic descriptions and representations are the ways used by those skilled in the data processing arts to most effectively convey the substance of their work to others skilled in the art. An algorithm or operation is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an implementation" or "one implementation" or the like throughout is not intended to mean the same implementation or implementation unless described as such. One or more implementations or implementations described herein may be combined in a particular implementation or implementation. The terms "first," "second," "third," "fourth," etc. as used herein are meant as labels to distinguish among different elements and may not necessarily have an ordinal meaning according to their numerical designation.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
responsive to detecting a power event, selecting a subset of a plurality of memory cells of the memory device, the memory device characterized by auxiliary read metadata identifying one or more read offsets for each of the plurality of memory cells of the memory device, the one or more read offsets representing corrections to read signals applied to the respective memory cell during a read operation;
performing one or more diagnostic read operations for each of the subset of the plurality of memory cells of the memory device; and
modifying the auxiliary read metadata by updating the one or more read offsets for at least some of the plurality of memory cells of the memory device.

2. The system of claim 1, wherein the power event comprises at least one of: powering down or powering up the memory device.

3. The system of claim 1, wherein the operations further comprise: applying the one or more updated read offsets to adjust a voltage applied to the respective memory cell during the read operation, wherein the one or more read offsets are computed to compensate for a charge loss that has occurred since programming of the respective memory cell.

4. The system of claim 1, wherein the read offsets for each of the plurality of memory cells depend on a charge state of the respective memory cell, the charge state being representative of data stored by the respective memory cell.

5. The system of claim 1, wherein the auxiliary read metadata comprise:
family-bin associations of each of a plurality of families of memory partitions of the memory device with one of a plurality of bins, each family comprising a set of memory partitions programmed within a time interval not exceeding a threshold time; and
bin-offset associations of each of the plurality of bins with a set of read offsets for the respective bin.

6. The system of claim 5, wherein modifying the auxiliary read metadata comprises changing a family-bin association of at least one of the plurality of families of memory partitions.

7. The system of claim 5, wherein modifying the auxiliary read metadata comprises changing a family-bin association of a first family of the plurality of families of memory partitions from an association with a first bin of the plurality of bins to an association with a second bin of the plurality of bins, wherein a largest of the set of read offsets for the second bin is larger than a largest of the set of read offsets for the first bin.

8. The system of claim 5, wherein the one or more diagnostic read operations include a first subset of operations directed to families of memory partitions associated with a first bin, the first subset of operations being performed starting from an oldest family associated with the first bin and in order of decreasing age of the families associated with the first bin, and wherein the first subset of operations is stopped once a family is detected whose association with the first bin is to be maintained.

9. The system of claim 1, wherein the subset of the plurality of memory cells of the memory device is selected randomly from the plurality of memory cells.

10. The system of claim 1, wherein performing the one or more diagnostic read operations comprises determining a plurality of error correction counts.

11. The system of claim 10, wherein modifying the auxiliary read metadata comprises obtaining an estimate of a read voltage value corresponding to a minimum error correction count of the determined plurality of error correction counts.

12. The system of claim 11, wherein obtaining the estimate of the read voltage value corresponding to the minimum error correction count comprises performing one or more iterations of increased accuracy until a predetermined resolution of the estimate is achieved.

13. A method comprising:
responsive to detecting a power event, selecting, by a processing device operatively coupled with a memory device, a subset of a plurality of memory cells of the memory device, the memory device characterized by auxiliary read metadata identifying one or more read offsets for each of the plurality of memory cells of the memory device, the one or more read offsets representing corrections to read signals applied to the respective memory cell during a read operation;
performing one or more diagnostic read operations for each of the subset of the plurality of memory cells of the memory device; and
modifying the auxiliary read metadata by updating the one or more read offsets for at least some of the plurality of memory cells of the memory device.

14. The method of claim 13, wherein the auxiliary read metadata comprise:
family-bin associations of each of a plurality of families of memory partitions of the memory device with one of a plurality of bins, each family comprising a set of memory partitions programmed within a time interval not exceeding a threshold time; and
bin-offset associations of each of the plurality of bins with a set of read offsets for the respective bin.

15. The method of claim 14, wherein modifying the auxiliary read metadata comprises changing a family-bin association of a first family of the plurality of families of memory partitions from an association with a first bin of the plurality of bins to an association with a second bin of the plurality of bins, wherein a largest of the set of read offsets for the second bin is larger than a largest of the set of read offsets for the first bin.

16. The method of claim 14, wherein the one or more diagnostic read operations include a first subset of operations directed to families of memory partitions associated with a first bin, the first subset of operations being performed starting from an oldest family associated with the first bin and in order of decreasing age of the families associated with the first bin, and wherein the first subset of operations is stopped once a family is detected whose association with the first bin is to be maintained.

* * * * *